(12) United States Patent
Oda

(10) Patent No.: US 6,505,332 B1
(45) Date of Patent: Jan. 7, 2003

(54) METHOD AND APPARATUS FOR GENERATING LOGIC CELL LIBRARY AND METHOD AND APPARATUS FOR WIRING LAYOUT USING THE SAME

(75) Inventor: Noriaki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 118 days.

(21) Appl. No.: 09/607,123

(22) Filed: Jun. 29, 2000

(30) Foreign Application Priority Data

Jul. 7, 1999 (JP) .......................................... 11-193228

(51) Int. Cl.[7] .............................................. G06F 17/50
(52) U.S. Cl. .............................. 716/12; 716/4; 716/11
(58) Field of Search ........................................ 716/1–18

(56) References Cited

U.S. PATENT DOCUMENTS 5,638,294 A * 6/1997 Sasada ........................... 716/5
6,189,131 B1 * 2/2001 Graef et al. .................... 716/8

FOREIGN PATENT DOCUMENTS

| JP | 08-194726 | 7/1996 | ........... G06F/17/50 |
| JP | 10-171855 | 6/1998 | ........... G06F/17/50 |
| JP | 10-214941 | 8/1998 | ........... H01L/27/04 |
| JP | 11-67916 | 3/1999 | ........... H01L/21/82 |

* cited by examiner

Primary Examiner—Matthew Smith
Assistant Examiner—Sun James Lin
(74) Attorney, Agent, or Firm—Hayes Soloway PC

(57) ABSTRACT

A logic cell library generating apparatus for calculating wiring resistance values using different values depending on the presence or absence of and/or the distance to an adjacent wire at respective positions of each wire to generate a logic cell library. The apparatus includes a device simulator for deriving capacitance values and resistance values at respective positions of respective wires; an adjacent wire information file for storing different wiring resistance values for respective positions of respective wires depending on the presence or absence of an adjacent wire on one side or both sides of each wire; a layout verification tool for verifying wiring layout using as its input the output from the device simulator, a provided mask layout pattern and the contents stored in the adjacent wire information file to derive input loads and output driving capability; a circuit simulator for simulating circuit operations based on the output from the layout verification tool, a provided net list and test standards; and a delay calculator for calculating a basic delay time obtained from wiring resistance for each position in each wiring based on the output from the circuit simulator. The basic delay time is stored in the logic cell library.

11 Claims, 6 Drawing Sheets

| WIRE NUMBER | WIRING RESISTANCE VALUE |
|---|---|
| 1 – 1 | 0 μm : R11, 10.5 μm : R12, 15.0 μm : R13, ⋯ |
| 1 – 2 | 0 μm : R12, 12.5 μm : R13, 17.0 μm : ⋯ |
| 1 – 3 | 0 μm : R11, 13.5 μm : R13, 18.0 μm : R14, ⋯ |
| ⋮ | ⋮ |
| 2 – 1 | 0 μm : R12, 10.5 μm : R14, 15.0 μm : R12, ⋯ |
| 2 – 2 | 0 μm : R12, 9.0 μm : R14, 11.0 μm : R12, ⋯ |
| 2 – 3 | 0 μm : R12, 8.5 μm : R14, 13.0 μm : R12, ⋯ |
| ⋮ | ⋮ |

METHOD AND APPARATUS FOR GENERATING LOGIC CELL LIBRARY AND METHOD AND APPARATUS FOR WIRING LAYOUT USING THE SAME

BACKGROUND OF THE INVENTION

1. Field of the Invention

The present invention relates generally to a method and an apparatus for wiring layout in designing circuit devices such as semiconductor integrated circuits, and more particularly to a method and an apparatus for calculating a basic delay time using different wiring resistance values depending on the existence of and/or the distance to an adjacent wire at respective positions of respective wires and generating a logic cell library which stores the basic delay time.

2. Description of the Related Art

With higher integration in semiconductor integrated circuits, longer wiring is integrated with smaller interval in a limited area within a circuit, and the. sectional shape of the circuit becomes finer and more complicated. As a result, wiring in the semiconductor integrated circuit has a larger resistance value and a larger capacitance value. Increases in the wiring resistance value and wiring capacitance value cause a longer wiring delay time accordingly since the wiring delay time is derived by multiplying the wiring resistance value by the wiring capacitance value. Such a longer wiring delay time tends to reduce the propagation speed of signals within the integrated circuit.

To solve the aforementioned problem, the present inventor has already proposed a new logic cell library generating apparatus and a wiring layout apparatus in JP-A-11067916. FIGS. 1 and 2 are diagrams showing the logic cell library generating apparatus and the wiring layout apparatus disclosed in JP-A-11067916, respectively.

The logic cell library generating apparatus shown in FIG. 1 comprises sectional shape file 101 for accumulating the sectional shape of wiring, material data file 102 for accumulating property constants of materials of the wiring or interlayer dielectrics, and arrangement information file 103 for storing information on the arrangement of the wiring. Data is inputted from these files 101 to 103 to device simulator 105 for deriving capacitance values and resistance values at respective positions in the wiring. Device simulator 105 outputs the capacitance values and resistance values which are to be stored in library 106. Mask layout pattern file 107, first net list file 109 and test standard file 111 store mask layout patterns, net lists and test standards, respectively. In this logic cell library generating apparatus, layout verification tool 108 verifies wiring layout using as its input the stored contents in library 106 and mask layout pattern file 107 to derive input loads and output driving capability. Layout verification tool 108 outputs the input load data and output driving capability data and these data are stored in storage device 110. Circuit simulator 112 refers to the output from storage device 110, the contents of first net list file 109 and the contents of test standard file 111 to perform a circuit simulation. First delay calculator 113 calculates a basic delay time based on the output from circuit simulator 112. The basic delay time thus calculated is stored in logic cell library 114.

The conventional wiring layout apparatus shown in FIG. 2 comprises router 133 for performing wiring layout using as its input the basic delay time stored in logic cell library 114 produced with the logic cell library generating apparatus shown in FIG. 1, and using the net list information stored in second net list file 132. On the output side of router 133, second delay calculator 135 is provided for calculating a delay time using as its input three-dimensional arrangement information on the wiring and the absence or presence of an adjacent wire outputted from router 133, and wiring capacitance values and wiring resistance values according to the three-dimensional wiring arrangement stored in library 134. Comparator 135 compares the delay time outputted from second delay calculator 135 with a reference value, and if the outputted delay time does not match the reference value, causes router 133 to start processing.

It should be noted that the adjacent wire in the foregoing refers to a wire (or wires) adjacent to a wire on one side or both sides thereof at respective positions in each wire. However, when an interval of certain distance (for example, 1000 nm) or more exists between a wire and its adjacent wire, the wire is considered as an isolated wire which has no adjacent wire, even if the two wires are arranged adjacently.

The presence of an adjacent wire significantly affects a wiring resistance value. The wiring resistance value has the largest value when adjacent wires exist respectively on both sides of a wire, and is the second larges value when an adjacent wire exists on one side of a wire. An isolated wire with no adjacent wires on either of the sides has the smallest wiring resistance value. Here, the adjacent wire of an objective wire is defined as a wire that exists within a predetermined distance (for example, 1000 nm) from the objective wire.

The invention disclosed in JP-A-11067916 generates, with the aforementioned configuration, logic cell library 114 for storing the capacitance values and resistance values at respective positions based on the sectional shape of multi-layered wiring, the property constants of materials of the wiring and interlayer dielectrics and the wiring arrangement information, and performs wiring layout using logic cell library 114.

However, a wire width and a wiring interval are smaller as wiring is finer, with the result that a completed wire width is significantly affected by the amount of a reactive product from a photoresist and etching gas which is attached to side walls of the wire at etching in a fabricating process of a semiconductor integrated circuit. A wider wiring interval causes a larger amount of the reactive product to be attached to the wire side walls, thereby making the wire width larger than the width defined by photolithography. On the other hand, when the wiring interval is smaller, the wire width is substantially the same as the width defined by the photolithography due to a smaller amount of the reactive product.

FIG. 3 shows dependence of a completed wire width obtained after etching of an aluminum wiring layer on a distance from an adjacent wire. In FIG. 3, a vertical axis represents the wire width after etching (in $\mu$m) while a horizontal axis represents a spacing from an adjacent wire (in $\mu$m). Black circles represent the case of adjacent wires existing on both sides, while white circles represent the case of an adjacent wire on one side at a distance of 1 $\mu$m or less. A design wire width is constant (300 nm). It can be seen from FIG. 3 that a wider wiring interval causes a wider completed wire width, and a difference occurs at an interval of approximately 300 nm in the completed wire width between the case of adjacent wires existing on both sides and the case of an adjacent wire on one side at a distance of 1 $\mu$m or less, and a near state of saturation is reached at a spacing of 1000 nm.

Since wiring has a certain length, it has a distributed constant value. The distributed constant value leads to delay during propagation of signals in the wiring, resulting in a difference in the arrival time of the signals, which is referred to as wiring delay. In a semiconductor integrated circuit or the like, a difference occurs between the time taken for a signal to reach a cell disposed near a cell and the time taken for a signal to reach a cell disposed at the end of wiring. The wiring delay is not particularly serious at a wire width of 0.5 µm or more.

The inherent delay of a cell is a value inherent in each cell and refers to a value of delay from the rise of input pins to the fall of output pins under non-load conditions where no load is applied to a logical gate. The wiring capacitance refers to a capacitance generated from interconnection of logic cells through a wire.

When portions with no adjacent wire are increased, the wire width and wiring resistance value are reduced accordingly, and a resultant delay time is inconsistent with a delay time estimated on the assumption that the wire width is constant. Since a difference in the wiring resistance value depending on the presence or absence of an adjacent wire and the distance to the adjacent wire is not considered in aforementioned JP-A-11067916, an actual wiring delay value is small than a wiring delay value estimated by using the logic cell library, creating the possibility that a design value is greatly different from an operational value.

SUMMARY OF THE INVENTION

It is an object of the present invention to provide a logic cell library generating apparatus for calculating wiring resistance values using different wiring resistance values depending on the presence or absence of an adjacent wire and the distance to the adjacent wire at respective positions in each wire to generate a logic cell library which stores a delay time due to the wiring resistance values.

It is another object of the present invention to provide a wiring layout apparatus for performing, wiring layout based on such a logic cell library.

The first object of the present invention is achieved by an apparatus for generating a logic cell library which stores a calculation result of a delay time of each wire and which is used in performing layout of wiring including a plurality of wires, the apparatus comprising a sectional shape file for storing a sectional shape of each wire; a material data file for storing property information of a material of the wiring; a wiring information file for storing wiring information representing a relationship of connection of the respective wires; a device simulator for referring to stored contents in the sectional shape file, the material data file and the wiring information file to derive capacitance values and resistance values at respective positions of the respective wires; an adjacent wire information file for storing different wiring resistance values for respective positions of the respective wires depending on information regarding distance to adjacent wire on one side or both sides of each wire; a layout verification tool for receiving output from the device simulator, a provided mask layout pattern and stored contents in the adjacent wire information file to verify wiring layout for deriving input loads and output driving capability; a circuit simulator for performing a simulation of circuit operations based on output from the layout verification tool, a provided net list and a test standard; and a delay calculator for calculating a basic delay time obtained from wiring resistance for each position of each wire based on the output from the circuit simulator, wherein the basic delay is stored in the logical cell library.

The second object of the present invention is achieved by a wiring layout apparatus comprising: a logic cell library for storing a delay time of each wire; a net list storing unit for storing a net list; a router for performing wiring layout based on contents stored in the logic cell library and the net list; an adjacent wire information file for storing different wiring resistance values for respective positions of respective wires depending on information regarding to distance to an adjacent on one side or both sides of each wire; a delay calculator for calculating a delay time of each position of each wire using three-dimensional information on wiring outputted from the router, and the resistance values at respective positions of the respective wires stored in the adjacent wire information file; and a comparator for comparing the delay time outputted from the delay calculator with a reference value to determine whether or not the delay time matches the reference value.

Since the present invention configured as described above employs the adjacent wire information file which stores different wiring resistance values depending on the information regarding the distance to an adjacent wire on one side or both sides of each wire for respective positions of respective wires, accurate wiring resistance values can be calculated. Thus, the layout verification tool derives correct input loads and output driving capability with which a circuit simulation is performed to calculate an accurate basic delay time for each logic cell, and the logic cell library which stores the delay time can be produced. Additionally, since the logic cell library which stores the accurate wiring resistance values is used, it is possible to reduce, for example, a clock skew in a semiconductor integrated circuit. Therefore, according to the present invention, wiring layout can be performed with high accuracy in designing a semiconductor integrated circuit or the like.

In the present invention, the information that an adjacent wire exists within a predetermined distance (for example, 1000 nm) from the wire is included within the scope of the information regarding distance to the adjacent wire.

The above and other objects, features, and advantages of the present invention will become apparent from the following description based on the accompanying drawings which illustrate examples of preferred embodiments of the present invention.

DESCRIPTION OF THE PREFERRED EMBODIMENT

Figure 1:
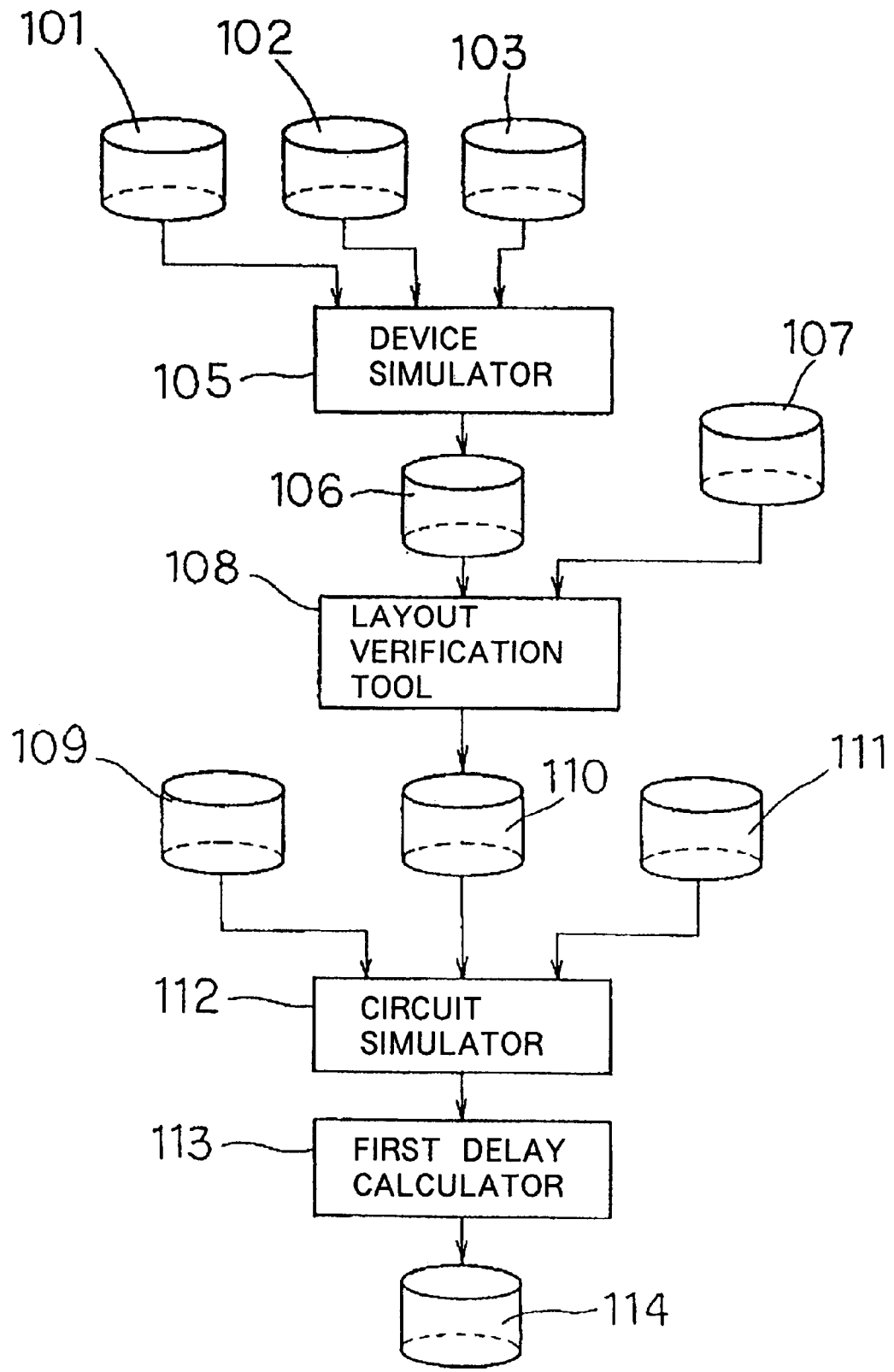
FIG. 1 is a block diagram showing a conventional logic cell library generating apparatus.
Figure 2:
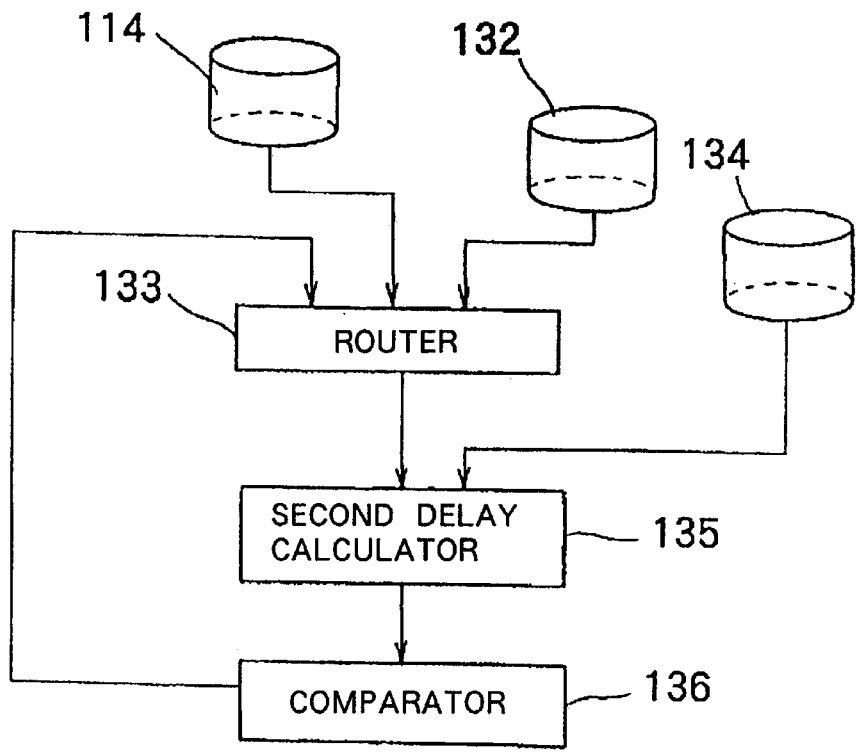
FIG. 2 is a block diagram showing a conventional wiring layout apparatus.
Figure 3:
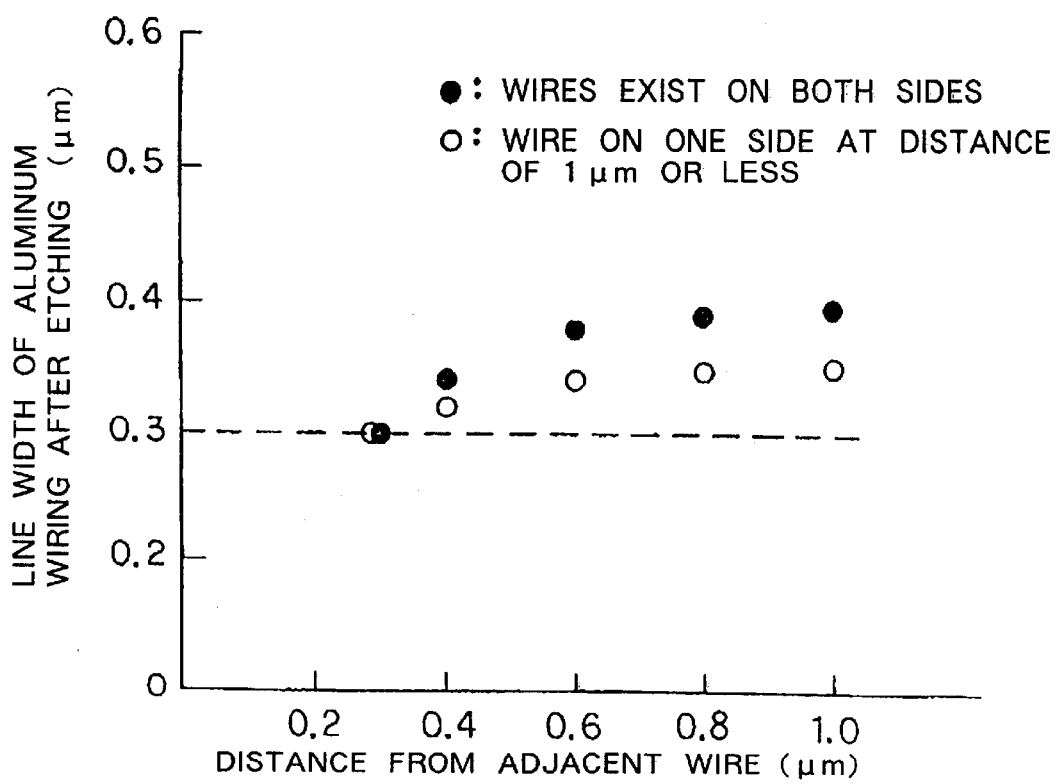
FIG. 3 is a graph showing dependence of a completed wire width on a distance from an adjacent wire.
Figure 4:
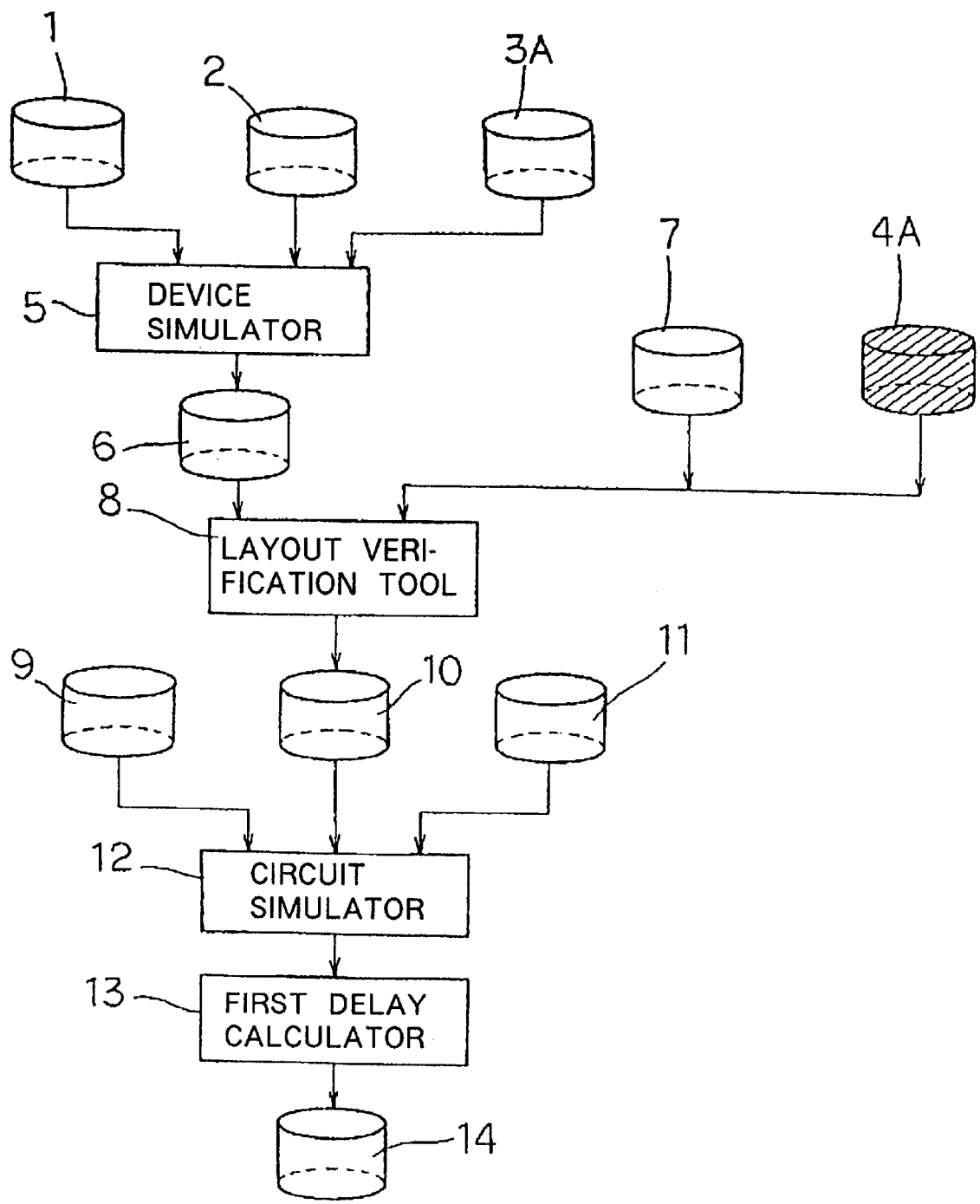
FIG. 4 is a block diagram showing a configuration of a logic cell library generating apparatus according to a preferred embodiment of the present invention.

A logic cell library generating apparatus according to a preferred embodiment of the present invention shown in FIG. 4 comprises wiring sectional shape file 1 for storing coordinate values representing the sectional shape of wiring and information on materials; material data file 2 for storing property information such as resistance values of materials of the wiring, relative dielectric constants of interlayer dielectrics or the like; wiring arrangement information file 3A for storing arrangements information such as the presence or absence of an upper or lower wiring layer, whether upper wiring and lower wiring are arranged in parallel or vertically; device simulator 5 for receiving as its input the contents stored in each of files 1, 2 and 3A to derive capacitance values and resistance values at respective positions in the wiring; library 6 for storing the capacitance values and resistance values outputted from device simulator 5; mask layout pattern file 7 for storing mask layout patterns; and adjacent wire information file 4A for storing different wiring resistance values for respective positions of respective wires depending on the information regarding the distance to an adjacent wire on one side or both sides. Here, in adjacent wire information file 4A, information of the presence or absence of an adjacent wire which is located on one or both sides within a predetermined distance (for example, 1000 nm) is used as the information regarding the distance to an adjacent wire. The apparatus further comprises layout verification tool 8 for receiving as its input the capacitance values and resistance values stored in library 6, the contents in mask layout pattern file 7 and the contents in adjacent wire information file 4A to verify layout; storage device 10 for storing input load data and output driving capability data which are output from layout verification tool 8; first net list file 9 for storing net lists; and test standard file 11 for storing test standards. The apparatus further comprises circuit simulator 12 for performing a circuit simulation based on the contents in first net list file 9, the contents stored in storage device 10 and the contents in test standard file 11; first delay calculator 13 for calculating a delay time based on the output contents from circuit simulator 12; and logic cell library 14 for storing the calculation result in first delay calculator 13.

Figures 5, 6:
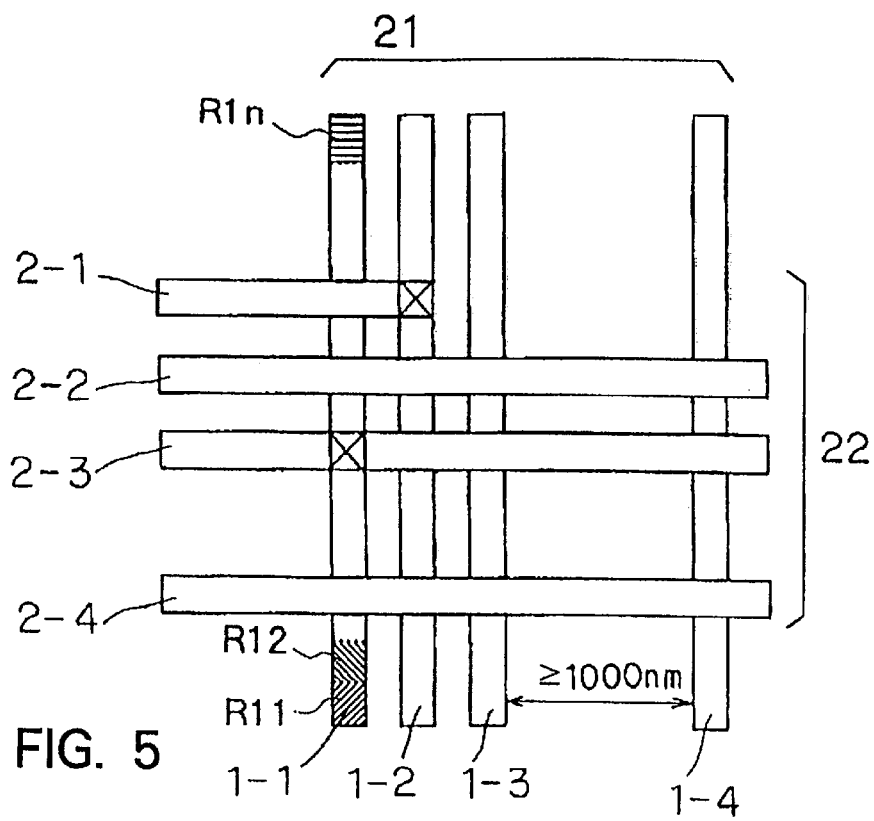
FIG. 5 is a plan view showing an example of wiring.
FIG. 6 is a diagram showing an example of contents of an adjacent wire information file.

In FIG. 4, adjacent wire information file 4A (the hatched portion in FIG. 4) characterizes the logic cell library generating apparatus of this embodiment. The contents in adjacent wire information file 4A are now described. Assume herein that the wiring is arranged as shown in FIG. 5. Adjacent wire information file 4A in this case is in the form of a table which stores wire numbers assigned to respective wires included in each wiring layer and wiring resistance values at respective positions in each wire indicated by the wire number as shown in FIG. 6. While FIGS. 5 and 6 show the case of three-layered wiring, similar adjacent wire information file 4A may be used for multi-layered wiring of four layers or more, with an increased table size. First layer wiring 21 comprising a plurality of wires is sequentially assigned serial numbers such as 1-1, 1-2, 1-3, 1-4, etc. Second layer wiring 22 is also sequentially assigned serial numbers such as 2-1, 2-2, 2-3, 2-4, etc. Wire 1-2 of first layer wiring 21 has wires 1-1 and 1-3 on both sides thereof, while wires 1-1 and 1-3 have an adjacent wire only on one side. Wire 1-4 is an isolated wire with a distance of 1000 nm or more from wire 1-3 which is an adjacent wire. If a distance from an adjacent wire is 1000 nm or more, a photoresist reacts with etching gas to form a deposit in forming actual wiring by etching of an aluminum film as a wiring material, resulting in a larger wire width.

Wire 1-2 has the largest wiring resistance value due to wires 1-1 and 1-3 present on both side thereof, wires 1-1 and 1-3 have the second largest wiring resistance value, and wire 1-4 which is an isolated wire has the smallest resistance value. In this manner, different resistance values are stored in adjacent wire information file 4A as wiring resistance values of the respective wires included in each wiring layer for the case of adjacent wires existing on both sides, for the case of an adjacent wire existing only on one side, and for the case of an isolated wire, respectively.

Therefore, assuming that the resistance values of wires 1-1, 1-2, 1-3 and 1-4 per unit length are R11, R12, R13 and R14, respectively, they are represented in descending order as R12>R11 (R13)>R14. The wiring resistance value is given as a function of a distance from a starting point (the position of a contact hole or via hole at one end of the wiring) of the first layer wiring. Similarly, the wiring resistance value of second layer wiring 22 is given as a function of a distance from a starting point (the position of a via hole at one end of the wiring) of the second layer wiring.

Next, the generation of a logic cell library in the logic cell library generating apparatus will now be described.

First, device simulator 5 receives the stored contents in wiring sectional shape file 1 and material data file 2 to perform a simulation for deriving capacitance values and resistance values at respective positions in the wiring. The output result from device simulator 5 is stored in library 6.

Next, layout verification tool 8 receives the stored contents in generated library 6, mask layout pattern file 7 and adjacent wire information file 4A to verify layout.

Then, the output result from layout verification tool 8 is stored in storage device 10. Circuit simulator 12 performs a circuit simulation using as its input the contents stored in storage device 10, first net list file 9 and test standard file 11. Finally, first delay calculator 13 calculates a basic delay time based on the output from circuit simulator 12. The calculation result of first delay calculator 13 is stored in logic cell library 14.

Figure 7:
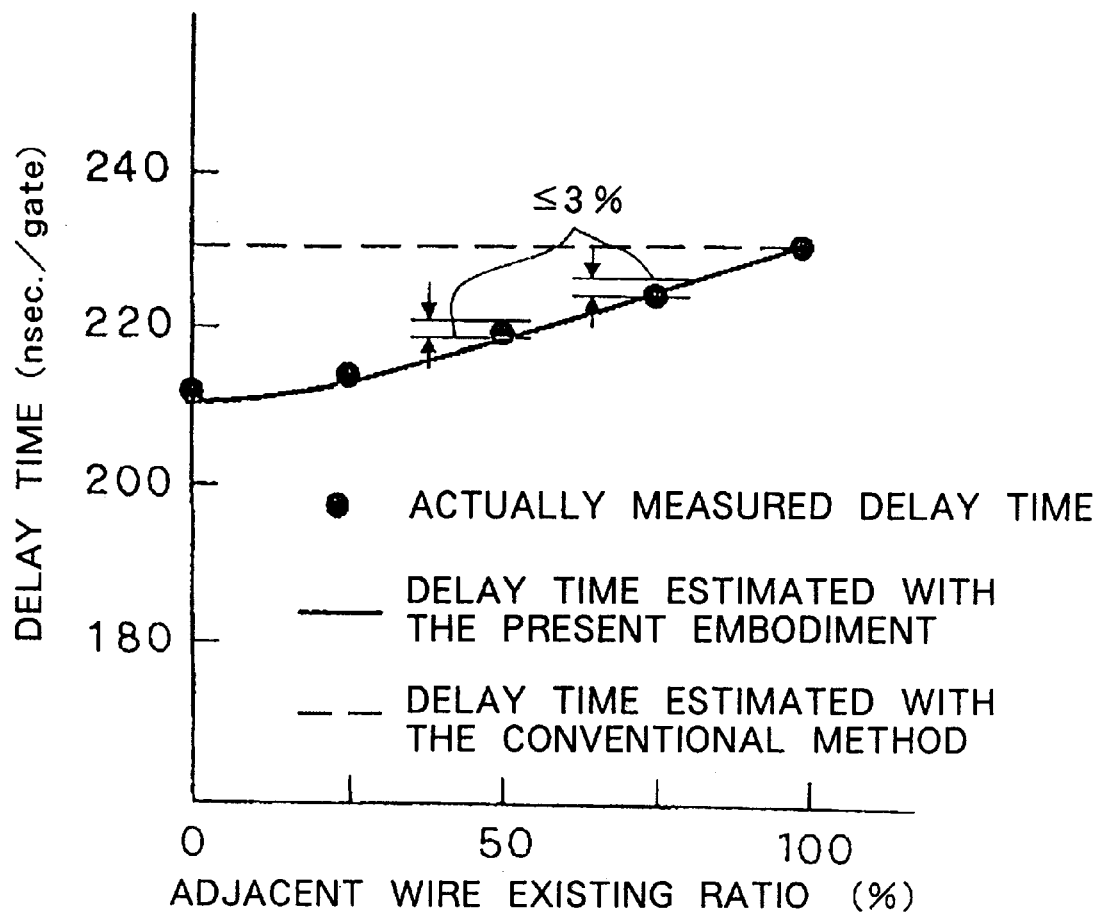
FIG. 7 is a graph showing dependence of a wiring delay time on an adjacent wire existing rate.

FIG. 7 shows a graph of dependence of a wiring delay time on adjacent wire existing rate. In FIG. 7, a vertical axis represents the delay time (in nsec./gate), while a horizontal axis represents the adjacent wire existing rate (in %). Black circles represent actually measured delay times, a solid line represents delay times estimated with the present embodiment, and a dashed line represents a delay time estimated with the conventional method.

This graph represents dependence of a delay time in the operation of an inverter with wiring loads on the adjacent wire existing rate, in which a total length of wiring is 2 mm. In transistors in a driving gate of the inverter, gate width of W of P-channel MOS (Metal-Oxide-Semiconductor) transistor was 30 $\mu$m, a gate width W of N-channel MOS transistor was 20 $\mu$m, gate length L was 0.18 $\mu$m, and fan out was one (1). A wire width was 0.3 $\mu$m, and a wiring interval was 0.3. The adjacent wire existing rate was obtained by dividing the length over which wires exist on both sides by the wiring length, represented in percentages. As compared with the conventional method in which the wire width is uniformly set independently of the presence or absence of an adjacent wire, a simulation result can be accurately matched with measured values when different resistance values are set depending on the presence or absence of an adjacent wire as in this embodiment. The accuracy varies with the adjacent wire existing rate. As shown in FIG. 7, as the adjacent wire existing rate is lower, the simulation result deviates from the measured values in the prior art. In contrast, the simulation values are matched with the measured values within accuracy of 3% in the embodiment.

As described above, according to the present invention, since different wiring resistance values can be stored depending on the presence or absence of an adjacent wire at respective positions of the respective wires, it is possible to calculate accurate wiring resistance values and to generate a logic cell library which stores the values.

Next, a wiring layout apparatus will now be described, wherein said apparatus performs wiring layout using the logic cell library produced as described above.

Figure 8:
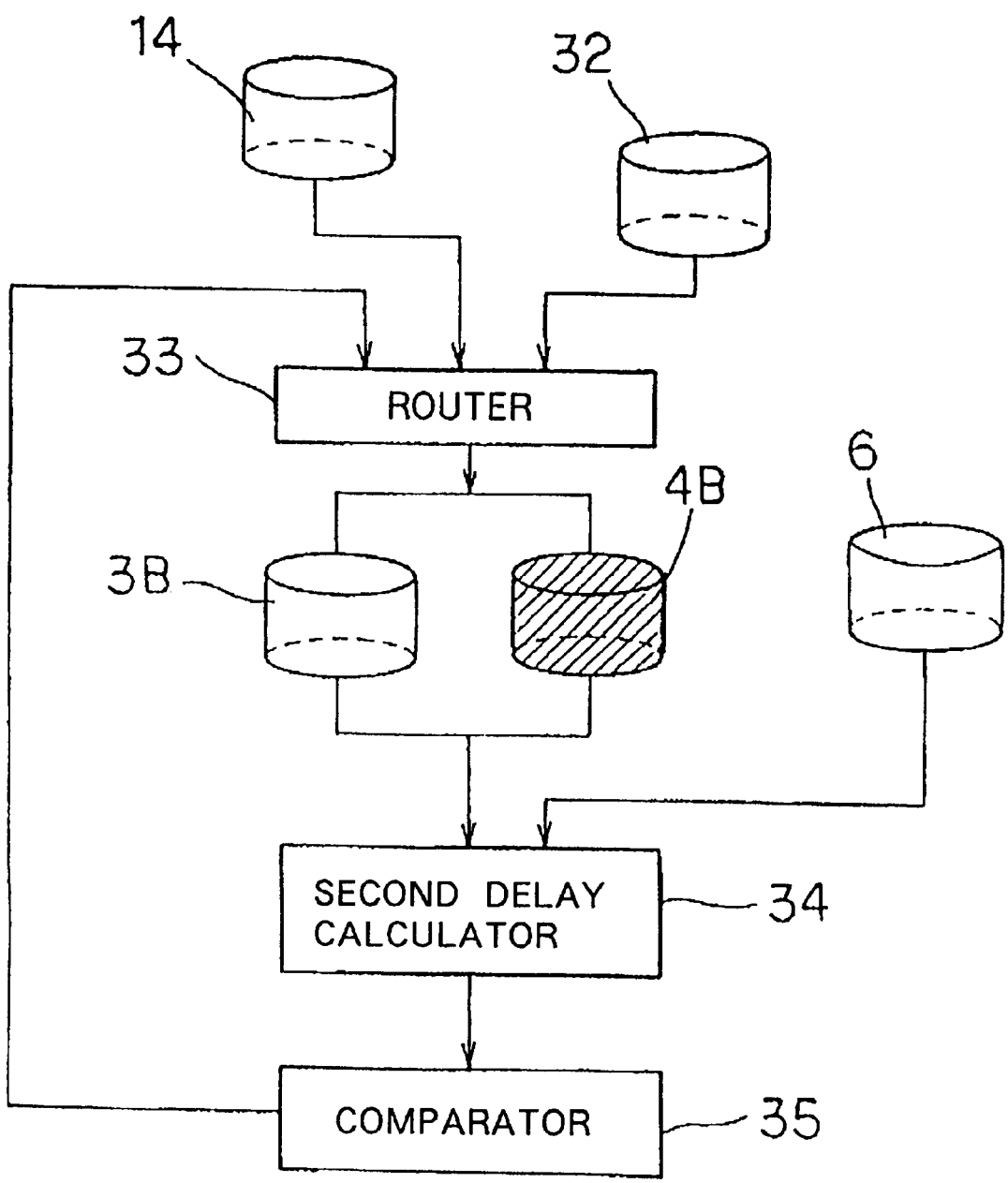
FIG. 8 is a block diagram showing a system configuration of a wiring layout apparatus according to another embodiment of the present invention.

The wiring layout apparatus shown in FIG. 8 comprises logic cell library 14 produced as described above; second net list file 32 for storing net lists; router 33 for performing wiring layout based on the contents of logic cell library 14 and second net list file 32; arrangement information file 3B for storing wiring arrangement information which is the output result from router 33; and adjacent wire information file 4B for storing different wiring resistance values depending on the presence or absence of an adjacent wire existing on one side or both sides for respective positions of respective wires. The wiring layout apparatus further comprises second delay calculator 34 for calculating a delay time using as its input the contents of files 3B, 4B and the contents stored in library 6 shown in FIG. 4; and comparator 35 for comparing the delay time outputted from second delay calculator 34 with a reference value and, if the delay time does not match the reference value, causing router 33 to again start processing.

Adjacent wire information file 4B (the hatched portion in FIG. 8) characterizes the wiring layout apparatus. Adjacent wire information file 4B has the same contents as that of adjacent wire information file 4A in the embodiment shown in FIG. 4.

The wiring layout apparatus uses, for the wiring layout, the wiring resistance values which are stored in library 6 and which depend on a three-dimensional arrangement of the wiring and the presence or absence of an adjacent wire. Thus, the wiring delay time can be estimated more accurately. Additionally, since the delay time is compared with the reference value and the wiring layout is repeated until the delay time falls within a reference range, it is possible to accurately control the delay time of a circuit, thereby reducing a clock skew (shift in clock signal) or the like. As a result, the wiring layout can be performed with high accuracy using the apparatus.

Next, the wiring layout using the wiring layout apparatus will now be described. First, router 33 is provided with the contents of logic cell library 14 and second net list file 32 to perform the wiring layout. Next, second delay calculator 34 received the contents of arrangement information file 3B which are the output result from router 33, the contents stored in adjacent wire information file 4B and the contents stored in library 6 to calculate the delay time of each wire. Finally, comparator 35 compares the delay time of each wire outputted from second delay calculator 34 with a reference value, and if the delay time does not match the reference value, router 33 repeats the wiring layout until the delay time falls within the reference range.

As described above, according to this embodiment, it is possible to perform wiring layout with high accuracy since the router again performs wiring layout if the delay time outputted from the comparator does not match the reference value.

While preferred embodiments of the present invention have been described using specific terms, such description is for illustrative purposes only, and it is to be understood that changes and variations may be made without departing from the spirit or scope of the following claims.

What is claimed is:

1. An apparatus for generating a logic cell library which stores a calculation result of a delay time of each wire and which is used in performing layout of wiring including a plurality of wires, said apparatus comprising:

a sectional shape file for storing a sectional shape of each wire;

a material data file for storing property information of a material of the wiring;

a wiring information file for storing wiring information representing a relationship of connection of the respective wires;

a device simulator for referring to the stored contents in said sectional shape file, said material data file and said wiring information file to derive capacitance values and resistance values at respective positions of the respective wires;

an adjacent wire information file for storing different wiring resistance values for respective positions of the respective wires depending on information regarding distance to an adjacent wire on one side or both sides of each wire, wherein, in said adjacent wire information file, said wiring resistance values are defined for each small incremental section of said wire such that a largest value is provided when adjacent wires exist each within a predetermined distance on both sides of said wire, a second largest value is provided when an adjacent wire exists within the predetermined distance on only one side of said wire, and a smallest value is provided for an isolated said wire with no adjacent wires within the predetermined distance on either side thereof;

a layout verification tool for receiving output from said device simulator, a provided mask layout pattern and the stored contents in said adjacent wire information file to verify wiring layout for deriving input loads and output driving capability;

a circuit simulator for performing a simulation of circuit operations based on output from said layout verification tool, a provided net list and a test standard; and a delay calculator for calculating a basic delay time obtained from wiring resistance for each position of each wire based on the output from said circuit simulator, wherein said basic delay is stored in said logical cell library.

2. The apparatus according to claim 1, wherein said property information includes information on a resistance value of the material of the wiring.

3. The apparatus according to claim 1, wherein said adjacent wire information file includes a table which stores wire numbers assigned to respective wires included in each layer, and the wiring resistance values per unit length at respective positions of the respective wires indicated by the wire numbers.

4. The apparatus according to claim 1, wherein said adjacent wire information file has the wiring resistance values provided as a function of a position from a contact hole or via hole at one end of the wiring.

5. The apparatus according to claim 3, wherein said adjacent wire information file has the wiring resistance values provided as a function of a position from a contact hole or via hole at one end of the wiring.

6. A method of generating a logic cell library, comprising the steps of:

providing an adjacent wire information file for storing different wiring resistance values for respective positions of respective wires depending on information regarding distance to an adjacent wire on one side or both sides of each wire, wherein, in said adjacent wire information file, said wiring resistance values are defined for each small incremental section of said wire such that a largest value is provided when adjacent wires exist each within a predetermined distance on both sides of said wire, a second largest value is provided when an adjacent wire exists within the predetermined distance on only one side of said wire, and a smallest value is provided for an isolated said wire with no adjacent wires within the predetermined distance on either side thereof;

verifying wiring layout by receiving contents stored in said adjacent wire information file, simulating circuit operations, and calculating a basic delay time obtained from wiring resistance at each position of each wire; and generating a logic cell library for storing said basic delay time.

7. A wiring layout apparatus comprising:

a logic cell library for storing a delay time of each wire;

a net list storing unit for storing a net list;

a router for performing wiring layout based on the contents stored in said logic cell library and said net list;

an adjacent wire information file for storing different wiring resistance values for respective positions of respective wires depending on information regarding distance to an adjacent wire on one side or both sides of each wire, wherein, in said adjacent wire information file, said wiring resistance values are defined for each small incremental section of said wire such that a largest value is provided when adjacent wires exist each within a predetermined distance on both sides of said wire, a second largest value is provided when an adjacent wire exists within the predetermined distance on only one side of said wire, and a smallest value is provided for an isolated said wire with no adjacent wires within the predetermined distance on either side thereof;

a delay calculator for calculating a delay time of each position of each wire using three-dimensional information on wiring outputted from said router, and the resistance values at respective positions of the respective wires stored in said adjacent wire information file; and a comparator for comparing the delay time outputted from said delay calculator with a reference value to determine whether or not the delay time matches the reference value.

8. The apparatus according to claim 7, wherein said adjacent wire information file is a table which stores wire numbers assigned to respective wires included in each layer, and the wiring resistance values per unit length at respective positions of the respective wires indicated by the wire numbers.

9. The apparatus according to claim 7, wherein said adjacent wire information file has the wiring resistance values provided as a function of a position from a contact hole or via hole at one end of the wiring.

10. The apparatus according to claim 8, wherein said adjacent wire information file has the wiring resistance values provided as a function of a position from a contact hole or via hole at one end of the wiring.

11. A method of wiring layout, comprising the steps of:

providing an adjacent wire information file for storing different wiring resistance values for respective positions of respective wires depending on presence or absence of an adjacent wire on one side or both sides of each wire, wherein, in said adjacent wire information file, said wiring resistance values are defined for each small incremental section of said wire such that a largest value is provided when adjacent wires exist each within a predetermined distance on both sides of said wire, a second largest value is provided when an adjacent wire exists within the predetermined distance on only one side of said wire, and a smallest value is provided for an isolated said wire with no adjacent wires within the predetermined distance on either side thereof;

performing wiring layout based on a logic cell library and a net list;

receiving the result of said wiring layout, the contents stored in said adjacent wire information file, and the contents stored in said logic cell library to calculate a delay time at each position of each wire; and comparing said delay time and a reference value, and if said delay time does not match the reference value, repeating said step of performing wiring layout until said delay time falls within a reference range.

* * * * *